(12) United States Patent
Tarui et al.

(10) Patent No.: US 10,707,910 B2
(45) Date of Patent: Jul. 7, 2020

(54) MICROWAVE MODULE

(71) Applicant: Mitsubishi Electric Corporation, Chiyoda-ku (JP)

(72) Inventors: Yukinobu Tarui, Chiyoda-ku (JP); Makoto Kimura, Chiyoda-ku (JP); Isamu Ryokawa, Shinagawa-ku (JP); Akimichi Hirota, Chiyoda-ku (JP); Hiroyuki Mizutani, Chiyoda-ku (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 228 days.

(21) Appl. No.: 15/780,288

(22) PCT Filed: Dec. 7, 2016

(86) PCT No.: PCT/JP2016/086437
§ 371 (c)(1),
(2) Date: May 31, 2018

(87) PCT Pub. No.: WO2017/099145
PCT Pub. Date: Jun. 15, 2017

(65) Prior Publication Data
US 2018/0351595 A1  Dec. 6, 2018

(30) Foreign Application Priority Data

Dec. 7, 2015 (JP) .................................. 2015-238821
May 20, 2016 (WO) .................. PCT/JP2016/065097

(51) Int. Cl.
*H04B 1/38* (2015.01)
*H01L 23/66* (2006.01)
(Continued)

(52) U.S. Cl.
CPC ............. *H04B 1/38* (2013.01); *H01L 23/552* (2013.01); *H01L 23/66* (2013.01); *H04B 1/40* (2013.01);
(Continued)

(58) Field of Classification Search
CPC .......... H04B 1/38; H04B 1/40; H05K 1/0203; H05K 1/0204; H05K 9/00; H05K 1/02; H05K 1/0222; H01L 23/66
See application file for complete search history.

(56) References Cited

U.S. PATENT DOCUMENTS

2002/0027011 A1* 3/2002 Park ........................ H01L 23/13
174/535
2003/0169575 A1* 9/2003 Ikuta .................... H01L 23/3677
361/761
(Continued)

FOREIGN PATENT DOCUMENTS

JP         4-196256 A        7/1992
JP      2008-235775 A       10/2008
(Continued)

OTHER PUBLICATIONS

International Search Report dated Jan. 10, 2017 in PCT/JP2016/086437 filed Dec. 7, 2016.

*Primary Examiner* — Jinsong Hu
*Assistant Examiner* — Farideh Madani
(74) *Attorney, Agent, or Firm* — Oblon, McClelland, Maier & Neustadt, L.L.P.

(57) ABSTRACT

A microwave module includes an RF device and a multi-layer resin substrate. The device includes a metal cover covering at least an internal circuit. The substrate includes a first end face on a side of the device, a second end face on a side opposite to the first end face, a signal through-holes surrounding the circuit and connected to the circuit, ground through-holes surrounding the signal through-holes and con- (Continued)

nected to the cover, a first surface ground provided on the first end face and connected to the cover, an inner layer surface ground connected to ground through-holes, and an RF transmission line surrounded by the ground through-holes, the first surface ground, and the inner layer surface ground, and connected to the signal through-hole.

4 Claims, 12 Drawing Sheets

(51) Int. Cl.
    *H04B 1/40*     (2015.01)
    *H05K 1/02*     (2006.01)
    *H01L 23/552*   (2006.01)
    *H05K 9/00*     (2006.01)
    *H05K 3/00*     (2006.01)
    *H05K 1/14*     (2006.01)
    *H05K 3/36*     (2006.01)
(52) U.S. Cl.
    CPC ......... *H05K 1/0203* (2013.01); *H05K 1/0204* (2013.01); *H05K 1/0222* (2013.01); *H05K 9/00* (2013.01); *H01L 2223/6611* (2013.01); *H01L 2223/6655* (2013.01); *H01L 2223/6666* (2013.01); *H01L 2224/32245* (2013.01); *H01L 2224/48091* (2013.01); *H01L 2224/48155* (2013.01); *H01L 2224/73265* (2013.01); *H01L 2924/14* (2013.01); *H01L 2924/1421* (2013.01); *H01L 2924/14215* (2013.01); *H01L 2924/15192* (2013.01); *H01L 2924/15311* (2013.01); *H01L 2924/15313* (2013.01); *H01L 2924/16251* (2013.01); *H01L 2924/19041* (2013.01); *H01L 2924/19105* (2013.01); *H01L 2924/19107* (2013.01); *H01L 2924/3025* (2013.01); *H01L 2924/30111* (2013.01); *H05K 1/144* (2013.01); *H05K 3/0061* (2013.01); *H05K 3/368* (2013.01); *H05K 2201/0311* (2013.01); *H05K 2201/10371* (2013.01); *H05K 2201/10416* (2013.01)

(56) References Cited

U.S. PATENT DOCUMENTS

2013/0257565 A1   10/2013  Masuda
2013/0320496 A1*  12/2013  Nishijima ........... H01L 23/4952
                                                                                                             257/532

FOREIGN PATENT DOCUMENTS

| JP | 2009-100168 A | 5/2009 |
| JP | 2011-187812 A | 9/2011 |
| JP | 2013-98200 A | 5/2013 |

* cited by examiner

MICROWAVE MODULE

FIELD

The present invention relates to a microwave module.

BACKGROUND

A conventional transmission/reception module installed in an electronic scanning antenna modulates the amplitude and phase of a Radio Frequency (RF) signal. This transmission/reception module includes a metal chassis to which a substrate made of resin or ceramic having some of RF devices mounted thereon, a high heat generation RF device such as a High Power Amplifier (HPA), and an RF connector are fixed by means of screws or a bonding agent. The substrate and the high heat generation RF device are connected to each other through bonding by a gold ribbon or a gold wire.

Electromagnetic waves are radiated from the RF device and a signal line exposed to a space, in particular, from a connection point of the gold ribbon or the gold wire interconnecting the RF device and the substrate. It is thus necessary to suppress the characteristic failure and the unstable operation resulting from the reduction of spatial isolation caused by the radiation and coupling of the electromagnetic waves.

For a conventional module disclosed in, for example, Patent Literature 1 below, a metal cover designed to take measures to improve the spatial isolation such as electromagnetic shield for dividing a space or a radio wave absorber is disposed to surround a plurality of RF devices.

CITATION LIST

Patent Literature

Patent Literature 1: Japanese Patent Application Laid-open No. 2009-100168

SUMMARY

Technical Problem

Unfortunately, the conventional module of Patent Literature 1, which requires the metal cover surrounding the RF devices, needs to take measures such as the installation of an electromagnetic shield or a radio wave absorber in order to suppress the coupling and resonance of the electromagnetic waves generated inside the metal cover. Thus, the above-described conventional art poses a problem of the increase in cost.

The present invention has been made in view of the above, and an object thereof is to obtain a microwave module capable of suppressing the increase in cost.

Solution to Problem

To solve the above problem and achieve the object, the present invention provides a microwave module comprising: a multilayer resin substrate including: a first end face on which a plurality of microwave devices is mounted, each of the microwave devices including a microwave circuit and an electromagnetic shield wall at least covering the microwave circuit; a second end face opposite to the first end face; a plurality of signal through holes, each of the signal through holes being connected to the microwave circuit; a plurality of ground through holes, each of the ground through holes being provided to surround the signal through holes and connected to the electromagnetic shield wall; a first surface ground provided on a side of the first end face and connected to the electromagnetic shield wall; an inner layer surface ground connected to the ground through holes; an inner layer signal line surrounded by a first group of ground through holes among the ground through holes, the first surface ground, and the inner layer surface ground, the inner layer signal line having one end connected to a first signal through hole among the signal through holes; a second signal through hole among the signal through holes, the second signal through hole having one end connected to an opposite end of the inner layer signal line; a second group of ground through holes among the ground through holes provided to surround the second signal through hole and connected to the inner layer surface ground; a first pad connected to an opposite end of the second signal through hole and formed on a surface on a side of the second end face; ground pads arranged so as to surround the first pad and connected to the second group of ground through holes; a second surface ground provided on the side of the second end face and connected to the ground pads; and a heat dissipator thermally connected to the microwave circuit, wherein the multilayer resin substrate is plural in number, each of the plural multilayer resin substrates is mounted on a cooling plate connected to the second surface ground, and is signal-connected to a distribution circuit board by a spring contact terminal, the distribution circuit being provided in a space between the cooling plate and the second end face, the distribution circuit board having a second pad formed on a surface thereof facing the multilayer resin substrate, the contact terminal being provided between the first pad and the second pad and being connected to each of the first pad and the second pad.

Advantageous Effects of Invention

The present invention achieves an effect of suppressing the increase in cost.

DESCRIPTION OF EMBODIMENTS

Hereinafter, a microwave module according to each of embodiments of the present invention will be described in detail with reference to the drawings. The invention is not limited to the embodiments.

First Embodiment

Figure 1:
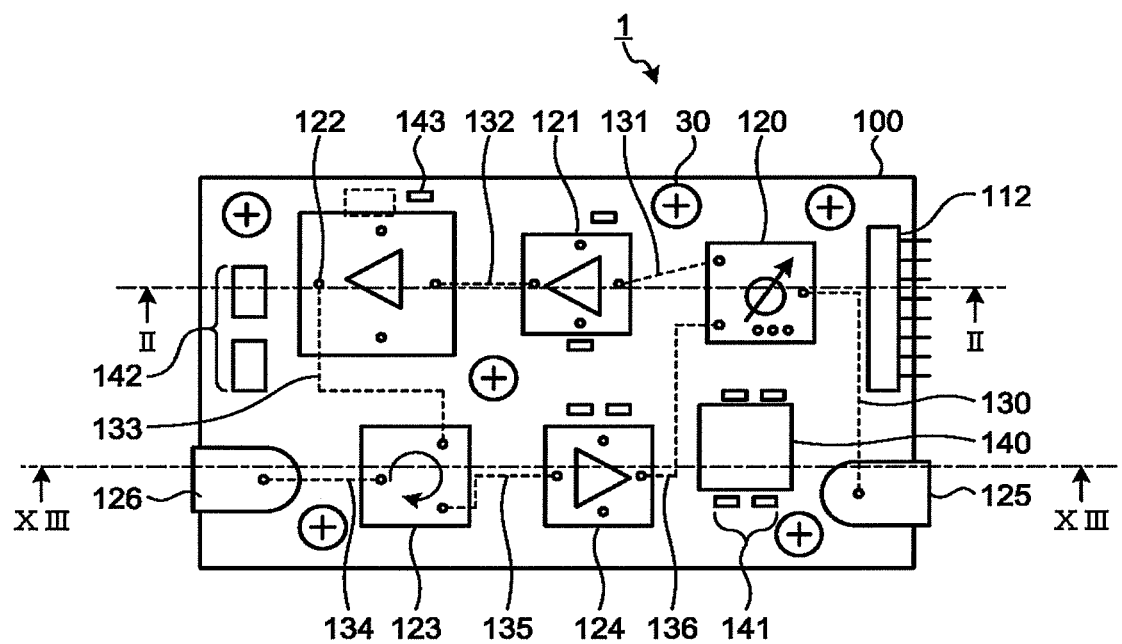
FIG. 1 is a front view of a microwave module according to a first embodiment.
Figure 2:
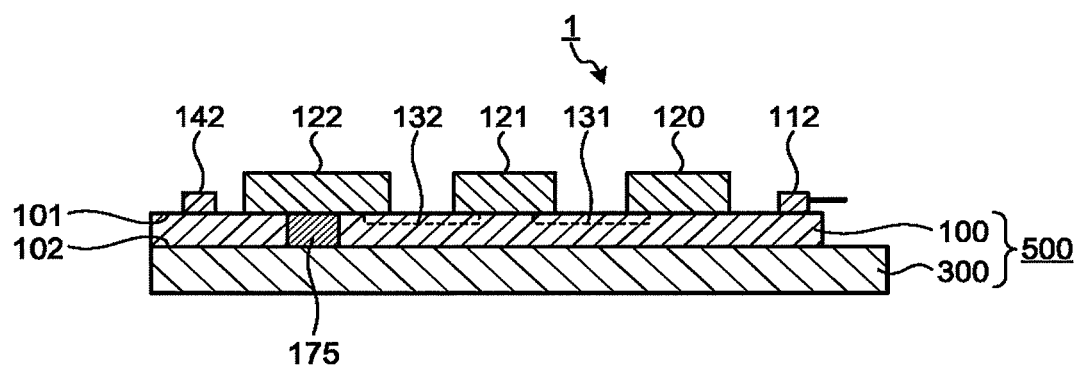
FIG. 2 is a cross-sectional view taken along line II-II of the microwave module illustrated in FIG. 1.
Figure 3:
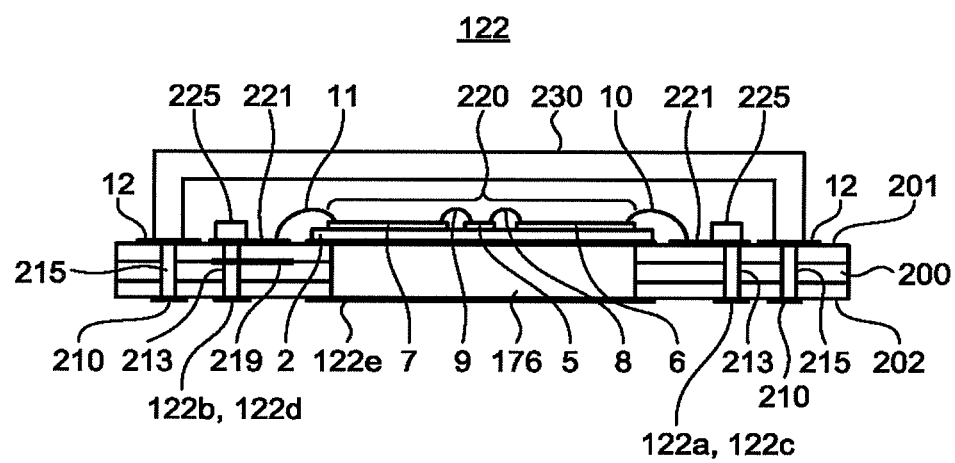
FIG. 3 is a view of details of an RF device illustrated in FIG. 2.
Figure 4:
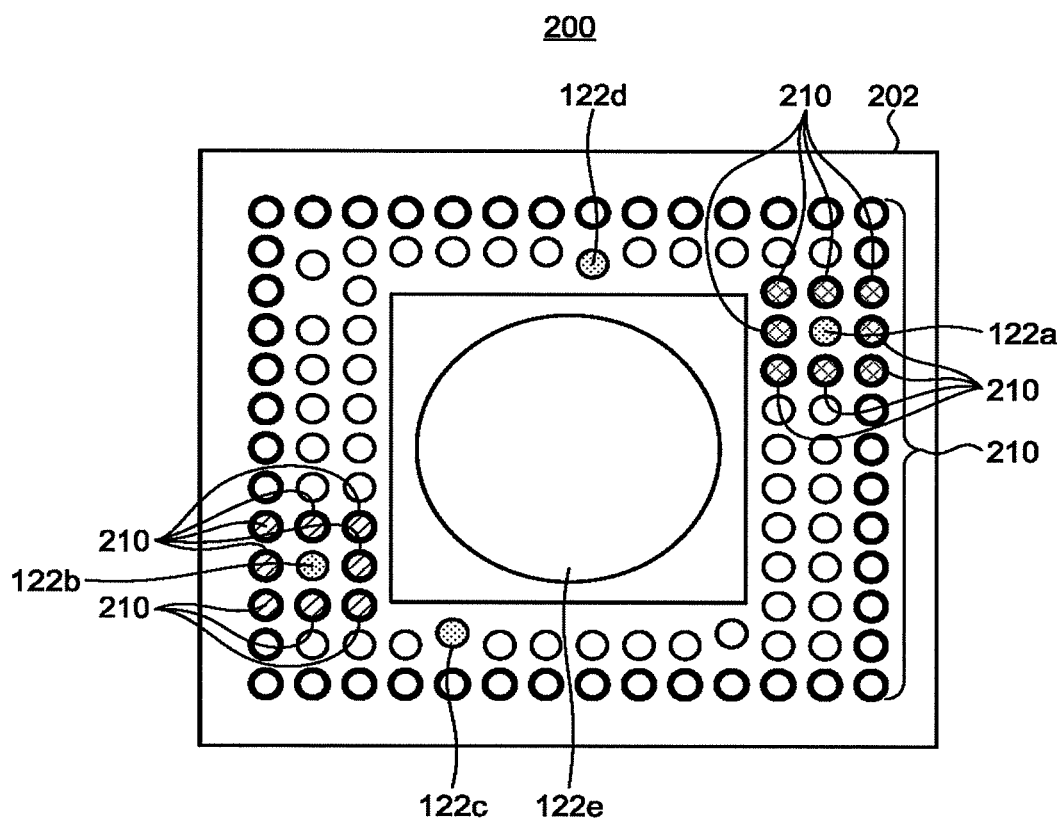
FIG. 4 is a view of a device substrate illustrated in FIG. 3 as seen from a fourth end face side of the device substrate.
Figure 5:
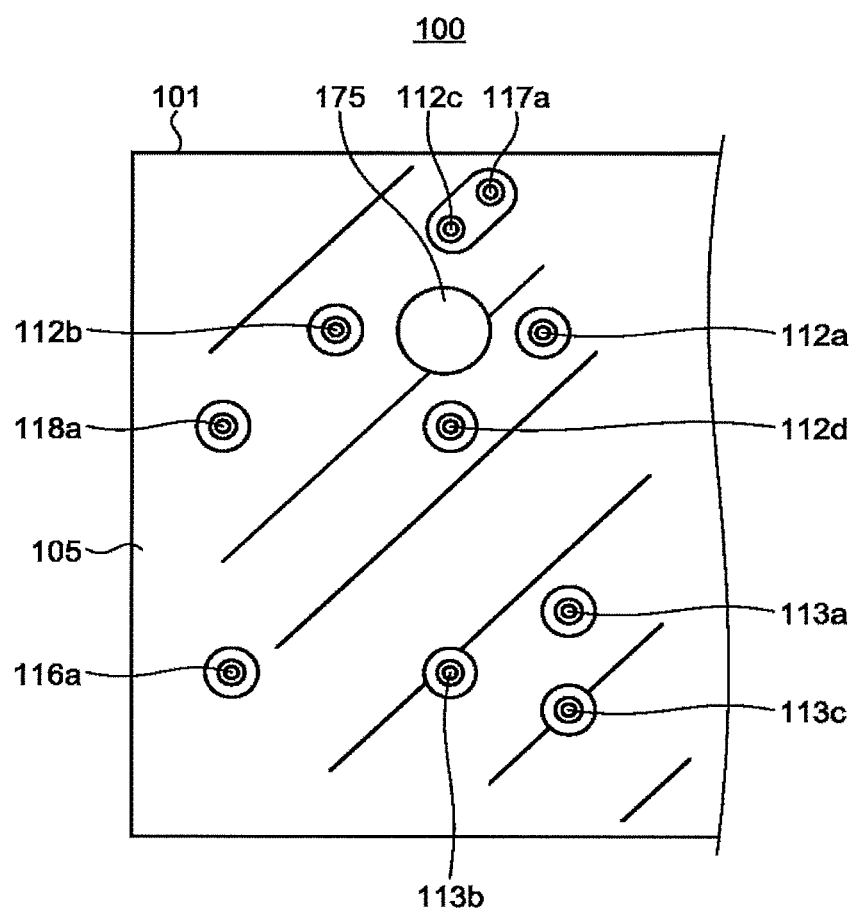
FIG. 5 is a view of a multilayer resin substrate illustrated in FIG. 1 as seen from a first end face side of the multilayer resin substrate.
Figure 6:
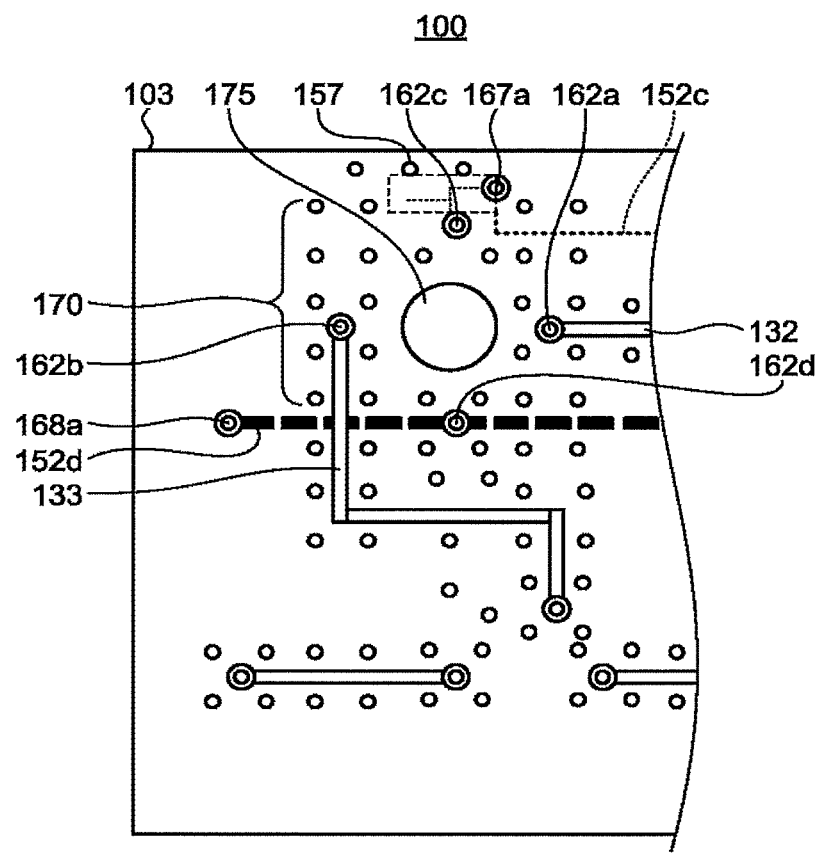
FIG. 6 is a view illustrating an inner layer portion of the multilayer resin substrate illustrated in FIG. 1.
Figure 7:
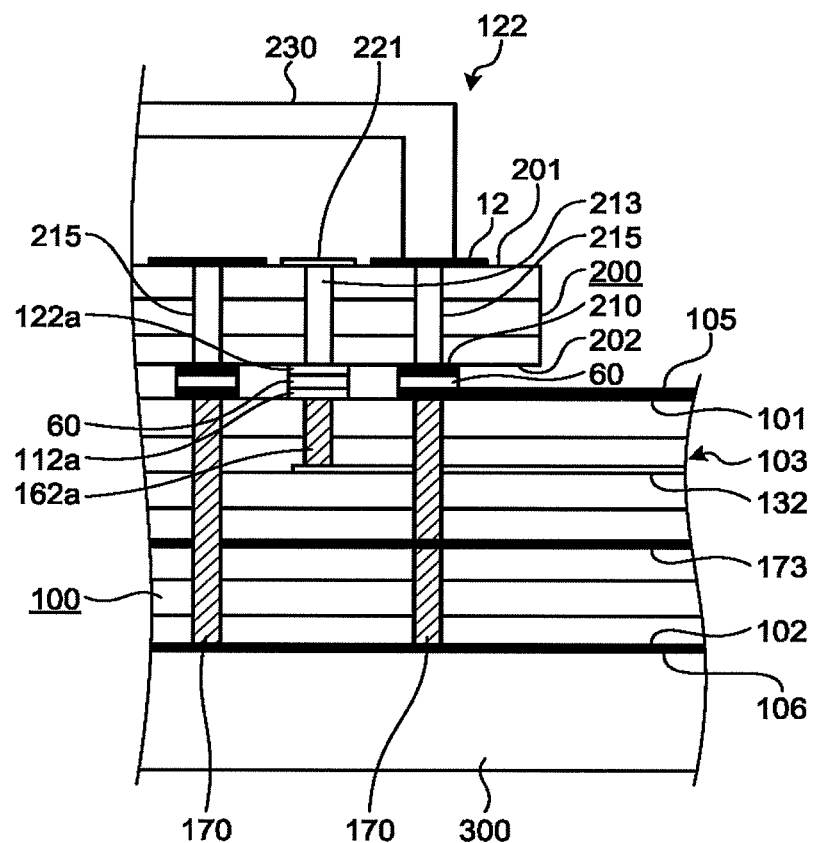
FIG. 7 is a cross-sectional view of the device substrate illustrated in FIG. 3 and the multilayer resin substrate illustrated in FIGS. 5 and 6.
Figure 8:
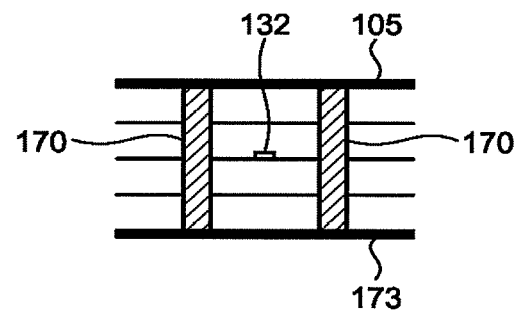
FIG. 8 is a cross-sectional view of a surface including a surface ground on the first end face side, an inner layer surface ground, and two ground through holes in the multilayer resin substrate illustrated in FIG. 7.

FIG. 1 is a front view of a microwave module according to a first embodiment. FIG. 2 is a cross-sectional view taken along line II-II of the microwave module illustrated in FIG. 1. FIG. 3 is a view of details of an RF device illustrated in FIG. 2. FIG. 4 is a view of a device substrate illustrated in FIG. 3 as seen from a fourth end face side of the device substrate. FIG. 5 is a view of a multilayer resin substrate illustrated in FIG. 1 as seen from a first end face side of the multilayer resin substrate. FIG. 6 is a view illustrating an inner layer portion of the multilayer resin substrate illustrated in FIG. 1. FIG. 7 is a cross-sectional view of the device substrate illustrated in FIG. 3 and the multilayer resin substrate illustrated in FIGS. 5 and 6. FIG. 8 is a cross-sectional view of a surface including a surface ground on the first end face side, an inner layer surface ground, and two ground through holes in the multilayer resin substrate illustrated in FIG. 7.

A configuration of the microwave module according to the first embodiment will be described with reference to FIGS. 1 to 8.

As illustrated in FIG. 2, the microwave module 1 includes a multilayer resin substrate 100 including a first end face 101 and a second end face 102 opposite to the first end face 101. The microwave module 1 is mechanically and thermally connected to a cooling plate 300 arranged on a side of the second end face 102 of the multilayer resin substrate 100.

The multilayer resin substrate 100 of the microwave module 1 is fixed to the cooling plate 300 by fixing screws 30 as illustrated in FIG. 1. One or multiple microwave modules 1, which are fixed to the cooling plate 300, and the cooling plate 300 define a microwave module 500 as illustrated in FIG. 2.

As illustrated in FIGS. 1 and 2, RF devices 120, 121, 122, 123, and 124, which are a plurality of first microwave devices, and a plurality of bypass capacitors 141, 142, and 143 are provided on a side of the first end face 101 of the multilayer resin substrate 100.

Provided on the side of the first end face 101 of the multilayer resin substrate 100 are a power-supply-circuit-side coaxial RF connector 125, an antenna-side coaxial RF connector 126, a control Integrated Circuit (IC) 140, and a power supply control connector 112.

In the first embodiment, the RF device 120 is a phase shifter and a switch.

In the first embodiment, the RF device 121 is a driver amplifier, the RF device 122 is an HPA, the RF device 123 is a circulator or a high-power handling switch, and the RF device 124 is a low noise amplifier.

As illustrated in FIGS. 1 and 2, a plurality of RF transmission lines 130 to 136 and a heat-dissipation embedded member 175 that serves as a first heat dissipator are provided inside the multilayer resin substrate 100. Specifically, the multilayer resin substrate 100 includes the heat-dissipation embedded member 175 connected to an internal circuit 220 that is a microwave circuit illustrated in FIG. 3. The heat-dissipation embedded member 175 is located in an area of the internal circuit 200 projected onto the multilayer resin substrate 100.

In FIG. 1, the power-supply-circuit-side coaxial RF connector 125 and the RF device 120 are connected to each other by the RF transmission line 130.

The RF device 120 and the RF device 121 are connected to each other by the RF transmission line 131.

The RF device 121 and the RF device 122 are connected to each other by the RF transmission line 132 that serves as an inner layer signal line.

The RF device 122 and the RF device 123 are connected to each other by the RF transmission line 133 that serves as an inner layer signal line.

The RF device 123 and the antenna-side coaxial RF connector 126 are connected to each other by the RF transmission line 134.

The RF device 123 and the RF device 124 are connected to each other by the RF transmission line 135.

The RF device 124 and the RF device 120 are connected to each other by the RF transmission line 136.

The power-supply-circuit-side coaxial RF connector 125 and the antenna-side coaxial RF connector 126 are each covered with outer conductors. The RF devices 120, 121, 122, 123, and 124 have their outer peripheral surfaces covered with ground through holes, a metal cover, or a metal-plated dielectric material.

As illustrated in FIG. 2, one end of the heat-dissipation embedded member 175 is connected to the RF device 122. The opposite end of the heat-dissipation embedded member 175 is connected to the cooling plate 300.

The heat-dissipation embedded member 175 is a heat dissipator for effectively transferring heat generated in the RF device 122 to the cooling plate 300, and is formed of metal such as copper, aluminum, or a copper alloy. In the first embodiment, the heat-dissipation embedded member 175 is in a shape of a cylinder or a quadrangular prism.

FIG. 3 illustrates an example of the RF device 122.

The RF device 122 includes a device substrate 200 including a third end face 201 and a fourth end face 202 opposite to the third end face 201.

The RF device 122 further includes a metal plate 2, the internal circuit 220, signal lines 221, and ground patterns 12. The metal plate 2 is provided on the third end face 201. The internal circuit 220, which is the microwave circuit, is provided on the metal plate 2. The signal lines 221 and the ground patterns 12 are provided on the third end face 201 and surround the internal circuit 220.

The RF device 122 further includes bypass capacitors 225 which suppress an RF superimposed wave and a metal cover 230 serving as an electromagnetic shield wall.

The metal plate 2 is a thermal expansion coefficient matching plate formed of an alloy of copper and molybdenum, or the like. The metal plate 2 is attached to the third end face 201 by adhesive or soldering.

The internal circuit 220 includes a transistor chip 5, an input matching circuit 6, and an output matching circuit 7, all of which are arranged on an upper surface of the metal plate 2.

The transistor chip 5 is disposed between the input matching circuit 6 and the output matching circuit 7.

The transistor chip 5, the input matching circuit 6, and the output matching circuit 7 are attached to the surface of the metal plate 2 by adhesive or soldering.

The transistor chip 5 and the input matching circuit 6 are connected to each other by a bonding wire 8.

The transistor chip 5 and the output matching circuit 7 are connected to each other by a bonding wire 9.

The input matching circuit 6 and the signal line 221 are connected to each other by a bonding wire 10.

The output matching circuit 7 and the signal line 221 are connected to each other by a bonding wire 11.

The types of the signal line 221 include an input RF line, a gate bias supply line, an output RF line, and a drain bias supply line.

The gate bias supply line is a line for supplying a gate bias to the internal circuit 220.

The drain bias supply line is a line for supplying a drain bias to the internal circuit 220.

The ground patterns 12 are provided outside the signal line 221 on the third end face 201 of the device substrate 200. That is, the ground patterns 12 are provided on the third end face 201 of the device substrate 200 and surround the internal circuit 220, the signal lines 221, and the bypass capacitors 225.

The metal cover 230 is provided on a side of the third end face 201 of the device substrate 200 so as to cover the internal circuit 220, the signal lines 221, and the bypass capacitors 225.

The metal cover 230 is connected to the ground patterns 12 by adhesive or soldering. A material used for the metal cover 230 is iron, stainless steel, aluminum, copper, brass or the like. The material may be a metal-plated dielectric material.

The device substrate 200 includes therein a plurality of signal through holes 213 connected to the signal lines 221, a plurality of ground through holes 215, and a heat-dissipation embedded member 176.

The heat dissipation embedded member 176 serving as a second heat dissipator is provided in a central portion of the device substrate 200 under the internal circuit 220.

One end face of the heat-dissipation embedded member 176 is connected to the metal plate 2. The opposite end face of the heat-dissipation embedded member 176 is connected to a ground pad 122e which is an end terminal of the heat-dissipation embedded member 176.

Similarly to the heat-dissipation embedded member 175, the heat-dissipation embedded member 176 is a heat dissipator for effectively transferring heat generated in the RF device 122 to the cooling plate 300.

The heat-dissipation embedded member 176 is formed of metal such as copper, aluminum, or a copper alloy. In the first embodiment, the heat-dissipation embedded member 176 is in a shape of a cylinder or a quadrangular prism.

The signal through holes 213 are provided inside the device substrate 200 and surround the metal plate 2 and the internal circuit 220.

The ground through holes 215 are located outside the locations of the signal through holes 213.

That is, the ground through holes 215 are provided inside the device substrate 200 and surround the signal through holes 213.

The ground through holes 215 are connected to the ground patterns 12.

As illustrated in FIG. 4, the device substrate 200 includes an input RF signal terminal 122a, an output RF signal terminal 122b, a gate control terminal 122c, and a drain power supply terminal 122d on the fourth end face 202 thereof. These terminals 122a, 122b, 122c, and 122d serve as terminals for transmitting or receiving signals to or from the multilayer resin substrate 100.

In addition, the device substrate 200 includes a plurality of ground terminals 210 and the ground pad 122e on the fourth end face 202 thereof.

The input RF signal terminal 122a is connected to the signal through hole 213 for an input RF line illustrated in FIG. 3.

The output RF signal terminal 122b is connected to the signal through hole 213 for an output RF line illustrated in FIG. 3.

The gate control terminal 122c is connected to the signal through hole 213 for a gate bias supply line illustrated in FIG. 3.

The drain power supply terminal 122d is connected to the signal through hole 213 for a drain bias supply line illustrated in FIG. 3.

Accordingly, the input RF signal terminal 122a, the output RF signal terminal 122b, the gate control terminal 122c, and the drain power supply terminal 122d are each connected to the signal line 221 through the corresponding signal through hole 213.

The ground terminals 210 are each connected to the corresponding one of the ground through holes 215. In the device substrate 200 of FIG. 4, the eight ground terminals 210 adjacent to the input RF signal terminal 122a surround the input RF signal terminal 122a to thereby form a pseudo coaxial structure. In the device substrate 200, also, the eight ground terminals 210 adjacent to the output RF signal terminal 122b surround the output RF signal terminal 122b to thereby form a pseudo coaxial structure.

Accordingly, the ground terminals 210 are each connected to the ground pattern 12 through the ground through hole 215. That is, the ground terminals 210 are each connected to the metal cover 230.

The bypass capacitor 225, which suppresses an RF superimposed wave, and an RF signal suppression filter 219 illustrated in FIG. 3 are disposed at the gate control terminal 122c and the drain power supply terminal 122d in correspondence to the superimposed wave.

As described above, the input RF signal terminal 122a, the output RF signal terminal 122b, the gate control terminal 122c, and the drain power supply terminal 122d are disposed such that the terminals 122a, 122b, 122c, and 122d are surrounded by the metal cover 230, the ground through holes 215, and the ground terminals 210.

Thus, mounting the RF device 122 on the multilayer resin substrate 100 described later electromagnetically shields the internal circuit 220, the signal lines 221, and the bypass capacitors 225, thereby suppressing the radiation of an electromagnetic wave generated in the RF device 122, to the outside of the RF device 122.

Similarly to the RF device 122 electromagnetically shielded as illustrated in FIG. 3, each of the RF devices 121, 123, and 124 illustrated in FIG. 1 has an electromagnetic shield wall defined by a metal cover or a metal-plated dielectric material covering and thus electromagnetically shielding the RF device.

In FIGS. 5, 6, and 7, the multilayer resin substrate 100 includes a land 112a, a land 112b, a land 112c, and a land 112d on the first end face 101 thereof.

The multilayer resin substrate 100 further includes a land 113a, a land 113b, a land 113c, a land 116a, a land 117a, and a land 118a on the first end face 101 thereof.

The multilayer resin substrate 100 further includes a surface ground 105 that is a first surface ground in a region other than each of the above-described lands on the first end face 101.

The land 112a is connected to the input RF signal terminal 122a.

The land 112b is connected to the output RF signal terminal 122b.

The land 112c is connected to the gate control terminal 122c.

The land 112d is connected to the drain power supply terminal 122d.

Each of the lands 113a, 113b, and 113c is connected to a signal terminal (not illustrated) provided in the RF device 123 illustrated in FIG. 1.

The land 116a is connected to a signal terminal (not illustrated) provided in the antenna-side coaxial RF connector 126 illustrated in FIG. 1.

The land 117a is connected to one signal terminal of the bypass capacitor 143 illustrated in FIG. 1.

The land 118a is connected to one signal terminal of the bypass capacitor 142 illustrated in FIG. 1.

Although only the region on a side of an antenna (not illustrated) of the multilayer resin substrate 100 is illustrated in FIG. 5, the other regions are configured similarly thereto.

As illustrated in FIG. 6, the multilayer resin substrate 100 includes an inner layer portion 103 thereof. The inner layer portion 103 of the multilayer resin substrate 100 includes an RF signal suppression filter 157, the RF transmission line 132, the RF transmission line 133, a signal through hole 162a, a signal through hole 162b, a signal through hole 162c, and a signal through hole 162d, all of which are first signal through holes.

The inner layer portion 103 of the multilayer resin substrate 100 further includes a through hole 167a, a through hole 168a, a plurality of ground through holes 170, a gate control signal line 152c, and a drain power supply line 152d.

As illustrated in FIG. 7, an inner layer surface ground 173 is provided in the inner layer portion 103 of the multilayer resin substrate 100.

On the second end face 102 of the multilayer resin substrate 100, a surface ground 106 as a second surface ground is provided.

The heat-dissipation embedded member 175 is provided in the multilayer resin substrate 100 such that the heat-dissipation embedded member 175 is surrounded by the four signal through holes 162a, 162b, 162c, and 162d and further surrounded by the ground through holes 170.

The signal through hole 162a is connected to the land 112a illustrated in FIG. 5 and is connected to the RF transmission line 132 illustrated in FIG. 6.

The signal through hole 162b is connected to the land 112b illustrated in FIG. 5 and is connected to the RF transmission line 133 illustrated in FIG. 6.

The signal through hole 162c is connected to the land 112c illustrated in FIG. 5 and is connected to the gate control signal line 152c illustrated in FIG. 6.

The signal through hole 162d is connected to the land 112d illustrated in FIG. 5 and is connected to the drain power supply line 152d illustrated in FIG. 6.

The through hole 167a is connected to the land 117a illustrated in FIG. 5.

The through hole 168a is connected to the land 118a illustrated in FIG. 5, and is connected to the drain power supply line 152d.

The ground through holes 170 are each connected to the surface ground 105 and the surface ground 106 illustrated in FIG. 7.

Thus, the input RF signal terminal 122a of the RF device 122 illustrated in FIG. 4 is connected to the RF transmission line 132 via the land 112a illustrated in FIG. 5 and the signal through hole 162a illustrated in FIG. 6.

The output RF signal terminal 122b of the RF device 122 illustrated in FIG. 4 is connected to the RF transmission line 133 illustrated in FIG. 6 via the land 112b illustrated in FIG. 5 and the signal through hole 162b illustrated in FIG. 6.

The gate control terminal 122c of the RF device 122 illustrated in FIG. 4 is connected to the gate control signal line 152c illustrated in FIG. 6 via the land 112c illustrated in FIG. 5 and the signal through hole 162c illustrated in FIG. 6.

The drain power supply terminal 122d of the RF device 122 illustrated in FIG. 4 is connected to the drain power supply line 152d illustrated in FIG. 6 via the land 112d illustrated in FIG. 5 and the signal through hole 162d illustrated in FIG. 6.

RF signals superimposed at the gate control terminal 122c and at the drain power supply terminal 122d illustrated in FIG. 4 are attenuated by the bypass capacitors 225 disposed inside the RF device 122 and a filter circuit (not illustrated), thereby suppressing the leakage of the RF signals to the gate control signal line 152c and the drain power supply line 152d in the multilayer resin substrate 100.

In the first embodiment, further, the RF signal suppression filter 157 for the gate control signal line is installed in the multilayer resin substrate 100 in correspondence to the amount of attenuation of the RF signals in the RF device 122, thereby suppressing an RF signal superimposed in the gate control signal line 152c.

The bypass capacitor 143 connected through the through hole 167a is a capacitor for suppressing a low frequency oscillation of the RF device 122. The bypass capacitor 142 connected via the through hole 168a is a capacitor attached for the purpose of suppressing the similar low frequency oscillation, and supplying electric charges.

The same applies to the RF transmission lines which interconnect the RF devices other than the RF device 122, and a description thereof will be omitted.

Next, a description is made as to the RF transmission line 132 in the multilayer resin substrate 100 being surrounded by grounds with identical potentials.

In FIG. 7, the signal through hole 213 and the ground through holes 215 in the device substrate 200 each form a pseudo coaxial line in the device substrate 200.

The signal through hole 162a and the ground through holes 170 in the multilayer resin substrate 100 each form a pseudo coaxial line in the multilayer resin substrate 100.

The signal through hole 213 of the RF device 122 is connected to the RF transmission line 132 via the input RF signal terminal 122a, the solder layer 60, the land 112a, and the signal through hole 162a.

The ground through holes 215 of the RF device 122 are each connected to the surface ground 106 via the ground terminal 210, the solder layer 60, the surface ground 105, and the ground through hole 170.

As illustrated in FIG. 8, the RF transmission line 132 inside the multilayer resin substrate 100 is surrounded by the surface ground 105, the inner layer surface ground 173, and the two ground through holes 170.

The cooling plate 300, the surface ground 105, the surface ground 106, the inner layer surface ground 173, the ground through holes 170, the ground through holes 215, and the metal cover 230 form electrical grounds with identical potentials, that is, pseudo electric walls.

Thus, a signal output from the RF device 122 is surrounded by the same grounds as a whole. As a result, the signal is not radiated to the outside but is transmitted to an RF device configured similarly to the RF device 122.

Operations of the microwave module 1 and the microwave module 500 will be described below.

A drain power for the RF device 122 is supplied from the power supply control connector 112 to the RF device 122 via the control IC 140 and the bypass capacitors 141, 142, and 143.

A device control signal including a gate control signal for the RF device 122 is transmitted from the power supply control connector 112 to the RF device 122 via the control IC 140 to operate the RF device 122 into a required state.

A transmission seed signal is input to the power-supply-circuit-side coaxial RF connector 125 and then is transmitted from the power-supply-circuit-side coaxial RF connector 125 to the RF device 120 through the RF transmission line 130.

The transmission seed signal transmitted to the RF device 120 is transmitted to the RF device 121, the RF device 122, the RF device 123, and the antenna-side coaxial RF connector 126, in order. The transmission seed signal is subjected to amplification and phase control during the transmission process, and is radiated into a space via the antenna (not illustrated).

A signal wave received by the antenna (not illustrated) is input to the antenna-side coaxial RF connector 126 as a received signal, and is transmitted from the antenna-side coaxial RF connector 126 to the RF device 123 through the RF transmission line 134.

The received signal transmitted to the RF device 123 is transmitted to the RF device 124, the RF device 120, and the power supply circuit-side coaxial RF connector 125, in order, and is subjected to signal combining by a distribution circuit (not illustrated).

Heat generated in the RF device 122 is transferred to the cooling plate 300 via the heat dissipation embedded member 176, the ground pad 122e, and the heat dissipation embedded member 175. Accordingly, the RF device 122 is cooled effectively.

Similarly, the other RF devices than the RF device 122, i.e. the RF devices 120, 121, 123, and 124 are each effectively cooled by the heat dissipation embedded members or the through holes depending on the amount of generated heat.

As described above, in the microwave module 1 of the first embodiment, pluralities of RF devices, signal lines, and RF transmission lines are stored inside the pseudo electric walls. Consequently, it is possible to suppress the radiation of electromagnetic waves generated inside the RF devices to the outside of the corresponding RF devices.

A conventional module requires a conductive module cover made of metal or the like for covering multiple RF devices all together, and in addition, requires an electromagnetic shield or a radio wave absorber to be installed in order to secure spatial isolation between the RF device terminals, which results in a problem of increasing the cost.

The microwave module 1 of the first embodiment requires neither such a module cover, nor the installation of the electromagnetic shield or the radio wave absorber inside such a module cover. It is therefore possible to achieve the reduction in cost, size, and weight.

Unlike a conventional structure in which a substrate and a device are screwed to a chassis and an input/output RF terminal and a line on the substrate are connected through bonding, the microwave module 1 of the first embodiment is configured such that all components are surface-mounted on the multilayer resin substrate 100. Consequently, it is possible to achieve the reduction in cost, size, and weight.

Since the microwave module 1 of the first embodiment has the plurality of RF devices surface-mounted on the multilayer resin substrate 100, there is no need to individually prepare a chassis that is a structure for each module, and the multilayer resin substrate 100 can be fixed directly to the cooling plate 300. Consequently, it is possible to achieve the reduction in cost, size, and weight.

The microwave module 500 of the first embodiment has the heat-dissipation embedded member 176 provided in the high heat generation RF device such as an HPA, and the heat-dissipation embedded member 175 provided in the multilayer resin substrate 100. This arrangement makes it possible to achieve the heat dissipation equivalent to that of the conventional structure in which the metal package is screwed to the chassis through the hollow resin structure.

The microwave module 500 of the first embodiment can avoid the increase in mass that has been conventionally caused by the installation of the chassis, the module cover, and the resonance suppressing component.

Second Embodiment

Figure 9:
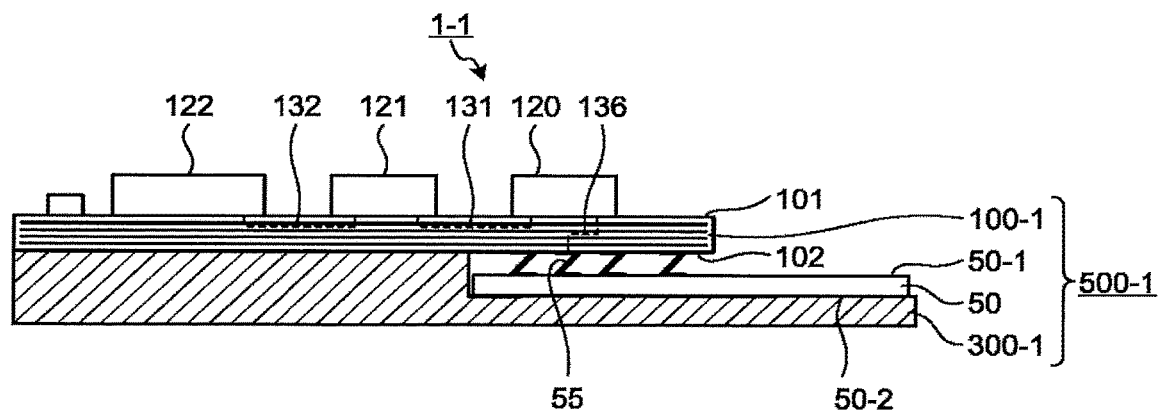
FIG. 9 is a cross-sectional view of a microwave module according to a second embodiment.
Figure 10:
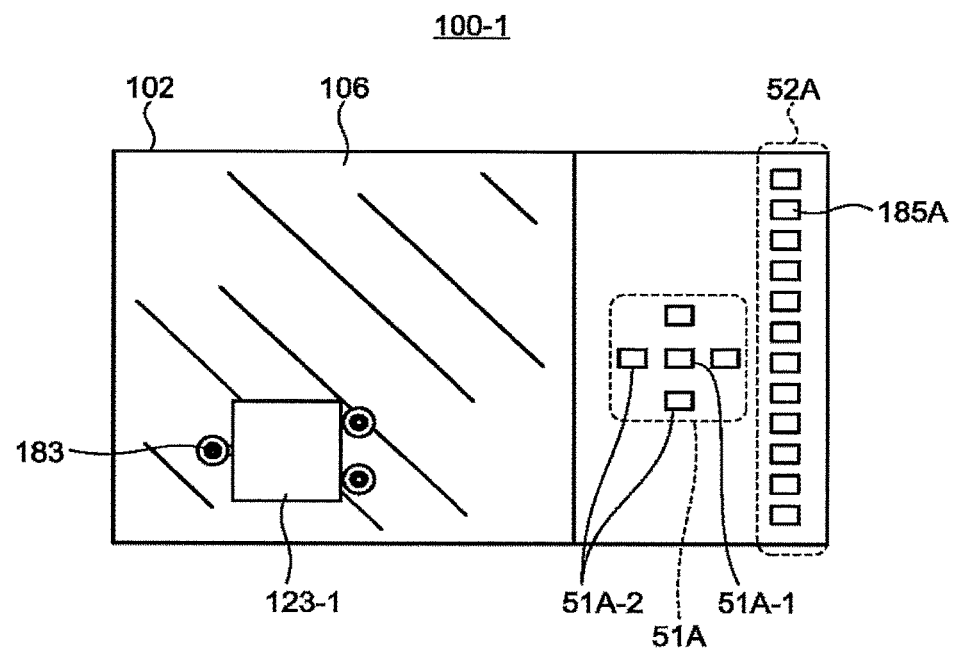
FIG. 10 is a view of a multilayer resin substrate illustrated in FIG. 9 as seen from a second end face side of the multilayer resin substrate.
Figure 11:
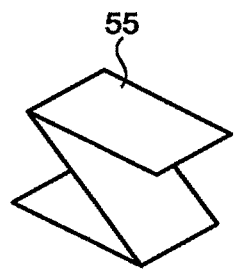
FIG. 11 is a perspective view of a contact terminal illustrated in FIG. 9.
Figure 12:
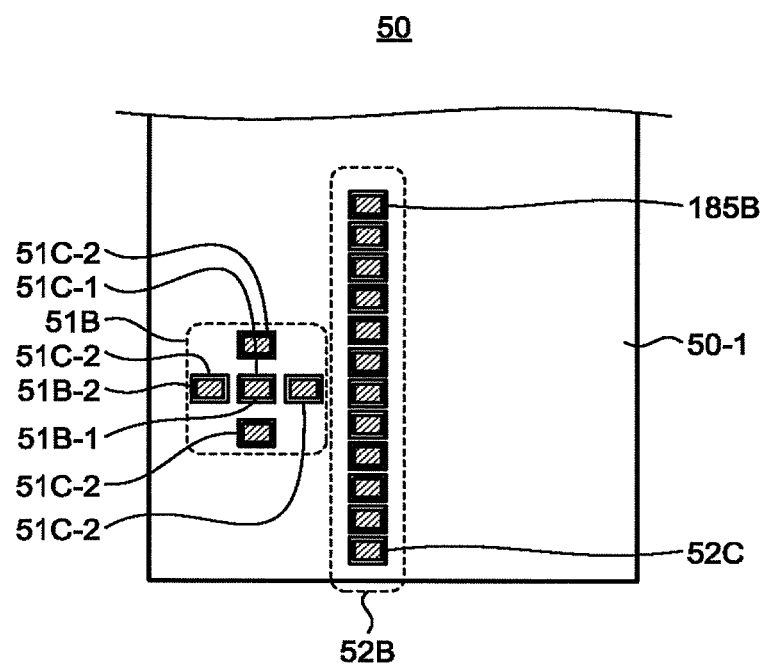
FIG. 12 is a view of a distribution circuit board illustrated in FIG. 9 as seen from a fifth end face side of the distribution circuit board.

FIG. 9 is a cross-sectional view of a microwave module according to a second embodiment. FIG. 10 is a view of a multilayer resin substrate illustrated in FIG. 9 as seen from a second end face side of the multilayer resin substrate. FIG. 11 is a perspective view of a contact terminal illustrated in FIG. 9. FIG. 12 is a view of a distribution circuit board illustrated in FIG. 9 as seen from a fifth end face side of the distribution circuit board.

The microwave module 1-1 of the second embodiment is different from the microwave module 1 of the first embodiment mainly in the following respects.

(1) The multilayer resin substrate 100-1 corresponding to the multilayer resin substrate 100 is used.

(2) An RF device 123-1 corresponding to the RF device 123 is used. The RF device 123-1 is an unshielded microwave device that is not electromagnetically shielded, which will be described later.

(3) The RF device 123-1 is provided on the second end face 102 of the multilayer resin substrate 100-1.

(4) A plurality of lands 183 for the RF device 123-1 is provided on the second end face 102 of the multilayer resin substrate 100-1 and surrounds the RF device 123-1.

(5) A power supply control connector pad 52A and a power supply control connector terminal 52B are provided in place of the power supply control connector 112. However, the power supply control connector 112 may be provided.

(6) An RF connector pad 51A and the power supply control connector pad 52A are provided on the second end face 102 of the multilayer resin substrate 100-1 at locations facing contact terminals 55 described later.

A microwave module 500-1 of the second embodiment is different from the microwave module 500 of the first embodiment mainly in the following respects.

(7) The microwave module 500-1 is defined by one or multiple microwave modules 1-1 and a cooling plate 300-1 corresponding to the cooling plate 300.

(8) A cavity 15 for storing the RF device 123-1 and the lands 183 is formed in the cooling plate 300-1. FIGS. 9 to 12 omit the illustration of the cavity 15, but the cavity 15 is illustrated by way of example in FIG. 14 described later.

(9) A distribution circuit board 50 which is a circuit board for supplying power, control signals, and RF signals to each device on the multilayer resin substrate 100-1 is provided on the cooling plate 300-1.

(10) The contact terminals 55 which are surface-mounted on the distribution circuit board 50 and have spring properties are provided.

The distribution circuit board 50 illustrated in FIG. 9 includes a fifth end face 50-1 and a sixth end face 50-2 opposite to the fifth end face 50-1. The RF device 120 and the RF device 121 are connected to each other by the RF transmission line 131 serving as an inner layer signal line. The RF device 121 and the RF device 122 are connected to each other by the RF transmission line 132 serving as an inner layer signal line. The RF device 120 and each contact terminal 55 are connected to one another by the RF transmission line 136 serving as an inner layer signal line.

The distribution circuit board 50 is provided on the cooling plate 300-1 such that the sixth end face 50-2 faces the cooling plate 300-1.

The RF device 123-1 illustrated in FIGS. 9 and 10 is a circulator or a high-power handling switch similarly to the RF device 123 of the first embodiment.

The lands 183 are, for example, an input RF signal terminal and an output RF signal terminal of the RF device 123-1.

The cavity 15 of the cooling plate 300-1 illustrated in FIG. 9 and the surface ground 106 of the multilayer resin substrate 100-1 form a pseudo electric wall.

It is thus possible to suppress radiation of an electromagnetic wave generated in the RF device 123-1 to the outside of the cavity 15.

As illustrated in FIG. 10, the RF connector pad 51A and the power supply control connector pad 52A are provided on a side of the second end face 102 of the multilayer resin substrate 100-1.

The RF connector pad 51A includes an RF signal pad 51A-1 and a plurality of ground pads 51A-2. The RF signal pad 51A-1 is a first pad for RF signal connection, and the ground pads 51A-2 surround the RF signal pad 51A-1.

The RF connector pad 51A, which includes the ground pads 51A-2 provided on the outer periphery of the RF signal pad 51A-1, forms a pseudo coaxial structure, such that when the RF connector pad 51A is connected to the distribution circuit board 50 described later, the RF connector pad 51A suppresses the radiation of an electromagnetic wave to the outside.

The power supply control connector pad 52A is defined by a plurality of pads 185A.

As illustrated in FIG. 11, each contact terminal 55 is a Z-shaped leaf spring.

As illustrated in FIG. 12, an RF connector terminal 51B and the power supply control connector terminal 52B provided by the contact terminals 55 are surface-mounted on a side of the fifth end face 50-1 of the distribution circuit board 50.

An RF signal pad 51C-1 and ground pads 51C-2 are provided on the side of the fifth end face 50-1 of the distribution circuit board 50. The RF connector terminal 51B is defined by an RF signal contact terminal 51B-1 and ground terminals 51B-2. The RF signal contact terminal 51B-1 is surface-mounted on the RF signal pad 51C-1. The ground terminals 51B-2 are surface-mounted on the ground pads 51C-2. The RF signal pad 51C-1 is a second pad for RF signal connection. The ground pads 51C-2 surround the periphery of the RF signal pad 51C-1. In the example of FIG. 12, each of the RF signal pad 51C-1 and the ground pads 51C-2 has a rectangular shape, and the four ground pads 51C-2 are arranged around the one RF signal pad 51C-1 to surround the one RF signal pad 51C-1.

The RF connector terminal 51B, which includes the ground terminals 51B-2 provided on the outer periphery of the RF signal contact terminal 51B-1, forms a pseudo coaxial structure, such that when the RF connector terminal 51B is connected to the RF connector pad 51A, the RF connector terminal 51B suppresses radiation of an electromagnetic wave to the outside.

A plurality of pads 52C is provided on the side of the fifth end face 50-1 of the distribution circuit board 50. The power supply control connector terminal 52B is defined by a plurality of contact terminals 185B surface-mounted on the pads 52C. In the example of FIG. 12, the contact terminals 185B are aligned in a row.

The multilayer resin substrate 100-1 is fixed with screws (not illustrated) to the cooling plate 300-1 provided with the distribution circuit board 50. As the screws are tightened to the cooling plate 300-1, each contact terminal 55 provided on the distribution circuit board 50 is compressed by the multilayer resin substrate 100-1 and the distribution circuit board 50.

Thus, flat surfaces on one end side of the contact terminals 55 are in surface-contact with the pads 185A, the RF signal pad 51A-1, and the ground pads 51A-2 on a side of the multilayer resin substrate 100-1.

As a result, the power, the control signals, and the RF signals are transmitted between the multilayer resin substrate 100-1 and the distribution circuit board 50.

Increasing the areas of the flat surfaces of the contact terminals 55 ensures that the contact terminals 55 contact the pads 185A, the RF signal pad 51A-1, and the ground pads 51A-2.

That is, the contact terminals 55 can have an increased allowable range enough to accommodate the possible misalignment between each of the central portions of the flat surfaces of the contact terminals 55 and the corresponding one of the central portions of the pads 185A, the RF signal pad 51A-1, and the ground pads 51A-2.

The shape of the contact terminals 55 is not limited to the Z shape, and the contact terminals 55 may be U-shaped springs, for example. A contact having spring properties, irrespective of the type thereof, may be used as the contact terminal 55. The contact terminal 55, which is a spring, may be configured to be surface-mounted on the RF signal pad 51A-1 that is a first pad illustrated in FIG. 10, or may be configured to be surface-mounted on the RF signal pad 51C-1 that is a second pad illustrated in FIG. 12.

The contact terminal 55 may be a point-contact-type spring pin and used as with the Z-shaped terminal, provided that the variation in contact points on the flat surfaces of the pads can be accommodated.

Although the second embodiment provides by way of example the contact terminals 55 surface-mounted on the side of the distribution circuit board 50, the contact terminals 55 may be surface-mounted on the side of the multilayer resin substrate 100-1.

For the microwave module 1-1 and the microwave module 500-1 of the second embodiment, as described above, the RF device 123-1 having a relatively small amount of heat dissipation can be used without being stored inside a metal package and employing an electromagnetic shield structure difficult to design for use with the RF device 123-1.

The use of a general-purpose RF device not designed to be electromagnetically shielded can reduce the cost.

The microwave module 1-1 and the microwave module 500-1 of the second embodiment can avoid the problems such as an increase in device size, an increase in cost, and deterioration of characteristics due to the provision of the electromagnetic shield.

The microwave module 1-1 and the microwave module 500-1 of the second embodiment are configured to transmit signals by using the contact terminals 55 having a large misalignment tolerance on the distribution circuit side. That is, when the multilayer resin substrate 100-1 is screwed to the cooling plate 300-1 at a predetermined position required for fitting of the antenna-side coaxial RF connector 126, the signal transmission can be achieved even if there is misalignment between each of the centers of the pads 185A and 51A-1, and 51A-2 of the multilayer resin substrate 100-1 and the corresponding one of the centers of the contact terminals 185B, 51B-1, and 51B-2 of the distribution circuit board 50, due to the manufacturing tolerances such as a substrate external dimension tolerance of the multilayer resin substrate 100-1, the surface mounting positioning tolerances of the RF connector terminal 51B and the power supply control connector terminal 52B, and the assembly misalignment tolerance with respect to the distribution circuit board 50.

For the microwave module 1-1 and the microwave module 500-1 of the second embodiment, an allowable range of misalignment can be increased. The contact terminals 185B and the pads 185A, which are in surface-to-surface contact with each other, provide another advantage that the current capacity is not large and thus the number of terminals can be reduced unlike a commonly used pin-type connector.

Figure 13:
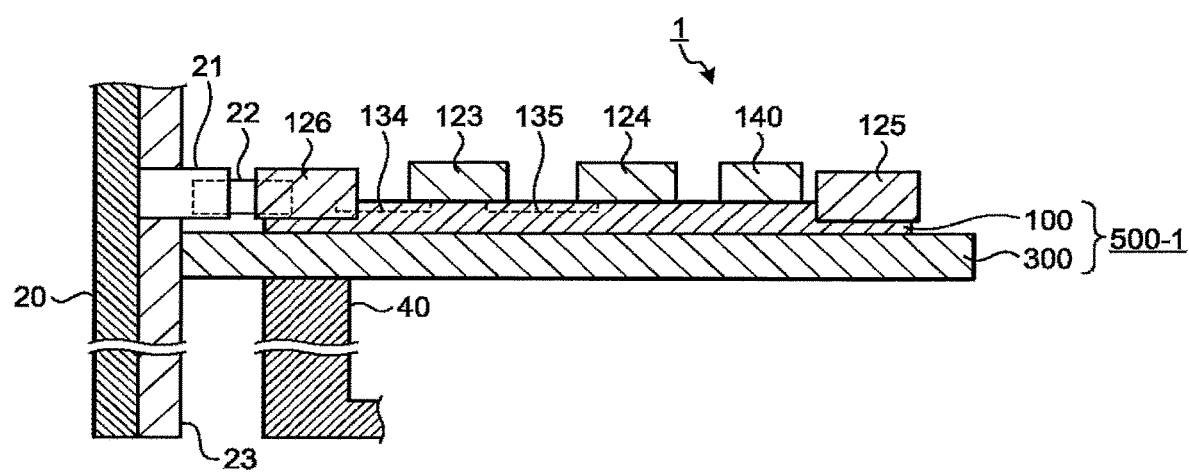
FIG. 13 is a cross-sectional view taken along line XIII-XIII of the microwave module according to the first embodiment.

FIG. 13 is a cross-sectional view taken along line XIII-XIII of the microwave module according to the first embodiment. FIG. 13 illustrates a substrate placement component 40 for fixing the microwave module 1 according to the first embodiment, an antenna panel 20, a coaxial connector 21 provided on the antenna panel 20, a relay connector 22 which interconnects the coaxial connector 21 and the antenna-side coaxial RF connector 126, and a cooling panel 23. The antenna-side coaxial RF connector 126 and the RF device 123 are connected to each other by the RF transmission line 134 that is an inner layer signal line. The RF device 123 and the RF device 124 are connected to each other by the RF transmission line 135 that is an inner layer signal line. The RF device 124 and the power supply circuit-side coaxial RF connector 125 are connected to each other by the RF transmission line 136, the RF device 120, and the RF transmission line 130, which are not illustrated. The cooling panel 23 is disposed between the antenna panel 20 and the cooling plate 300, contacts the cooling plate 300, and is thermally connected to the cooling plate 300. The cooling plate 300 and the microwave module 1 define the microwave module 500, as described above. One end of the relay connector 22 is connected to the coaxial connector 21 and the opposite end of the relay connector 22 is connected to the antenna-side coaxial RF connector 126, such that RF signal transmission terminals (not illustrated) included in the coaxial connector 21, the relay connector 22, and the antenna-side coaxial RF connector 126 are connected to one another. Although FIG. 13 illustrates the one coaxial connector 21 and the one microwave module 1, a plurality of coaxial connectors 21 is provided actually on the antenna panel 20, and the microwave module 1 is connected to each of the coaxial connectors 21. That is, a plurality of microwave modules 1 is connected to the one antenna panel 20. As illustrated in FIG. 13, since the cooling plate 300 contacts the cooling panel 23, heat generated in the RF device 123 is transferred to the multilayer resin substrate 100, the cooling plate 300, and the cooling panel 23. Then, the heat transferred to the cooling panel 23 is dissipated by a cooler (not illustrated) installed outside the antenna panel 20.

As illustrated in FIG. 13, the cooling plate 300 constituting the microwave module 1 is installed on the substrate placement component 40. Specifically, a plurality of cooling plates 300 defines one block, and a plurality of blocks is installed on the substrate placement component 40. Then, the substrate placement component 40 on which the blocks are installed is screwed to the antenna panel 20 and the cooling panel 23 by screws (not illustrated). In some case, the center positions of the coaxial connector 21 and the antenna-side coaxial RF connector 126 are not aligned with each other due to a dimensional tolerance of each of the substrate placement component 40, the antenna panel 20, and the microwave module 1, and a component mounting accuracy. In the configuration example illustrated in FIG. 13, the coaxial connector 21 and the antenna-side coaxial RF connector 126 are connected to each other via the relay connector 22 in consideration of such dimensional tolerances. Use of the relay connector 22 makes it possible to accommodate the misalignment between the coaxial connector 21 and the antenna-side coaxial RF connector 126 as well as to transmit an RF signal between the antenna panel 20 and the microwave module 1.

Figure 14:
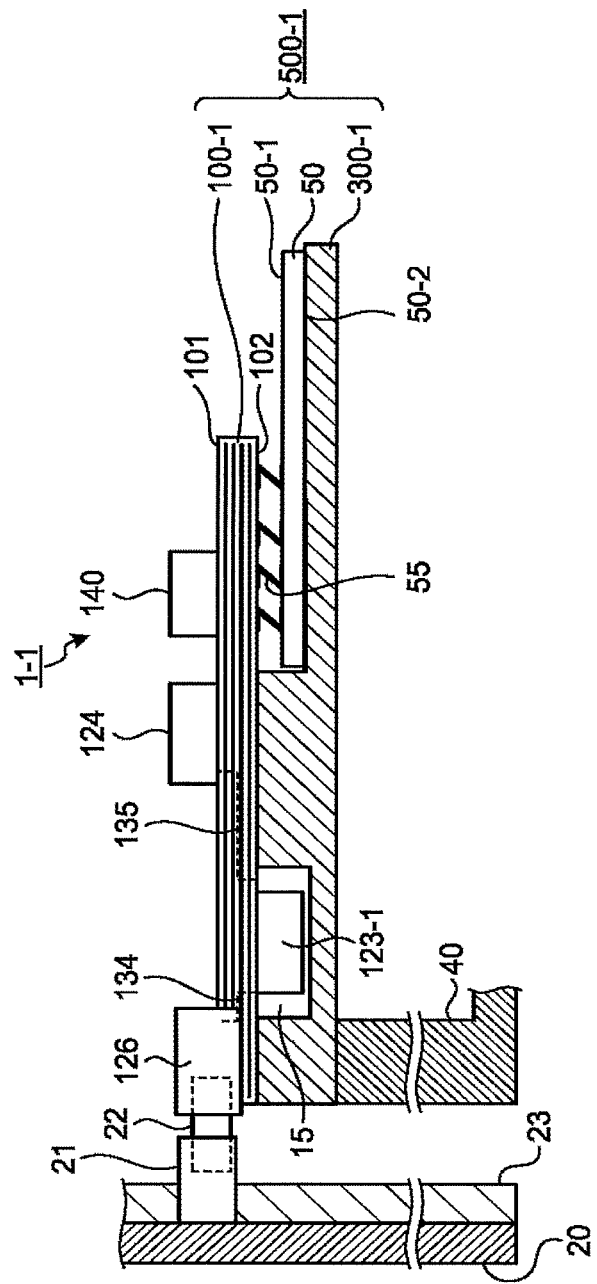
FIG. 14 is a cross-sectional view illustrating a connection between the microwave module according to the second embodiment and an antenna.

FIG. 14 is a cross-sectional view illustrating a connection between the microwave module according to the second embodiment and an antenna. As illustrated in FIG. 14, the cooling plate 300-1 of the microwave module 500-1 is installed on the substrate placement component 40. The distribution circuit board 50 is provided on the cooling plate 300-1 while the cavity 15 which stores the RF device 123-1 that is a second microwave device is formed on the cooling plate 300-1. The contact terminals 55 are provided between the distribution circuit board 50 and the multilayer resin substrate 100-1. The RF device 123-1 is accommodated in the cavity 15 and is electromagnetically shielded.

The antenna-side coaxial RF connector 126 and the RF device 123-1 are connected to each other by the RF transmission line 134 serving as an inner layer signal line. The RF device 123-1 and the RF device 124 are connected to each other by the RF transmission line 135 that is an inner layer signal line. The RF device 124 and the contact terminals 55 are connected to each other by the RF transmission line 136, the RF device 120, and the RF transmission line 130, which are not illustrated. The structure illustrated in FIG. 13 accommodates the dimensional tolerance by using the relay connector 22. The structure illustrated in FIG. 14 accommodates the misalignment between the antenna-side coaxial RF connector 126 formed on the multilayer resin substrate 100-1 and the coaxial connector 21 by not only the relay connector 22 but also the contact terminals 55 having a spring structure.

Figure 15:
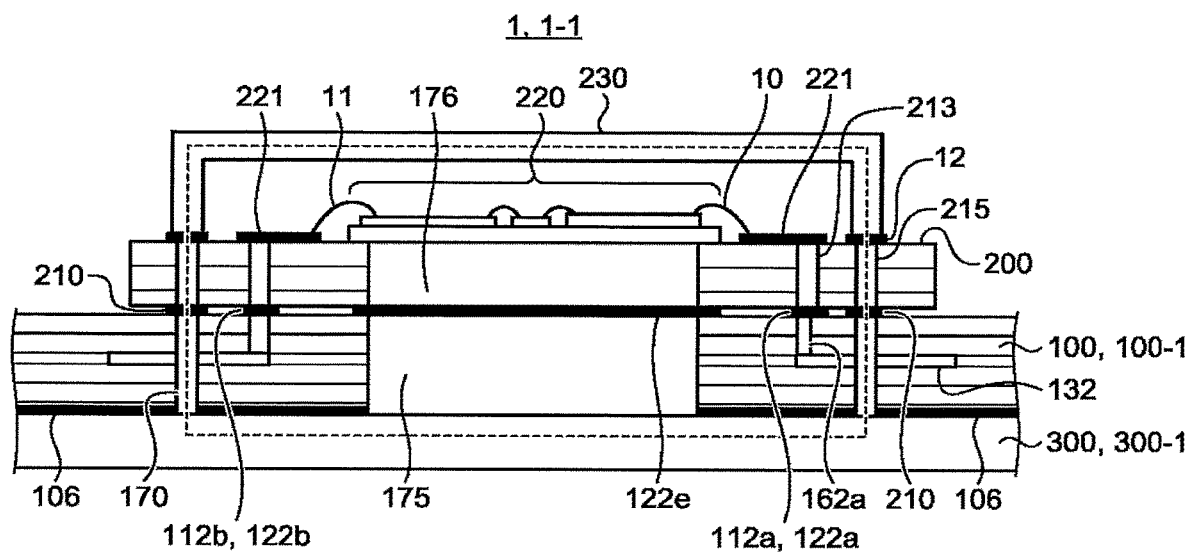
FIG. 15 is a partial cross-sectional view of the microwave modules according to the first and second embodiments.

FIG. 15 is a partial cross-sectional view of the microwave modules according to the first and second embodiments. In the microwave modules 500 and 500-1 according to the first and second embodiments, as illustrated in FIG. 15, the heat dissipation embedded member 176 embedded in the device substrate 200 of the RF device 122 and the one end side of the heat dissipation embedded member 175 provided in the multilayer resin substrates 100 and 100-1 contact each other via the ground pad 122e, and the opposite end side of the heat dissipation embedded member 175 contacts the cooling plates 300 and 300-1. As described above, the heat dissipation embedded member 175 and the heat dissipation embedded member 176 are disposed in a stacked position between the internal circuit 220 and the cooling plates 300 and 300-1. This structure allows the heat generated in the RF device 122 to be transferred to the cooling plate 300 via the heat dissipation embedded member 175 and the heat dissipation embedded member 176, such that the microwave modules 500 and 500-1 of the first and second embodiments achieves the effective cooling of the RF device 122 covered with the metal cover 230 on the device substrate 200.

Figure 16:
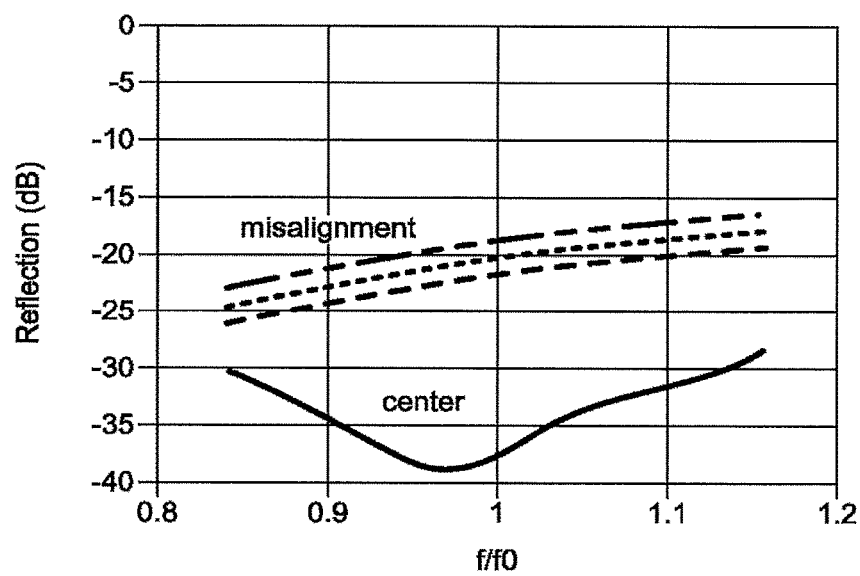
FIG. 16 is a diagram for explaining an effect of the contact terminal provided in the microwave module according to the second embodiment.

FIG. 16 is a diagram for explaining an effect of the contact terminals provided in the microwave module according to the second embodiment. In FIG. 16, the vertical axis represents a reflection loss and the horizontal axis represents a frequency. The contact terminal 55 discussed in relation to FIG. 16 is defined as follows. Each flat surface of the opposing ends of the contact terminal 55 is sized to have a short side of 1.5 mm and a long side of 1.7 mm. The contact terminal 55 has its height of 1.0 mm from the one end to the opposite end. The microwave module 1-1 according to the second embodiment, which reduces a relative influence of the displacement amount by using the contact terminal 55 as described above, maintains the good characteristics such as a reflection loss of about 20 dB even when a relative position between the contact terminal 55 and the corresponding pad shifts from a designed center by a certain amount. Examples of such a certain amount include a shift amount in a horizontal direction of ±0.5 mm and a shift amount in a vertical direction of ±0.125 mm. The reflection loss of 20 dB indicates that only 1/100 of incident energy is reflected, and 99% of the energy is transmitted into the microwave module 1-1.

Figure 17:
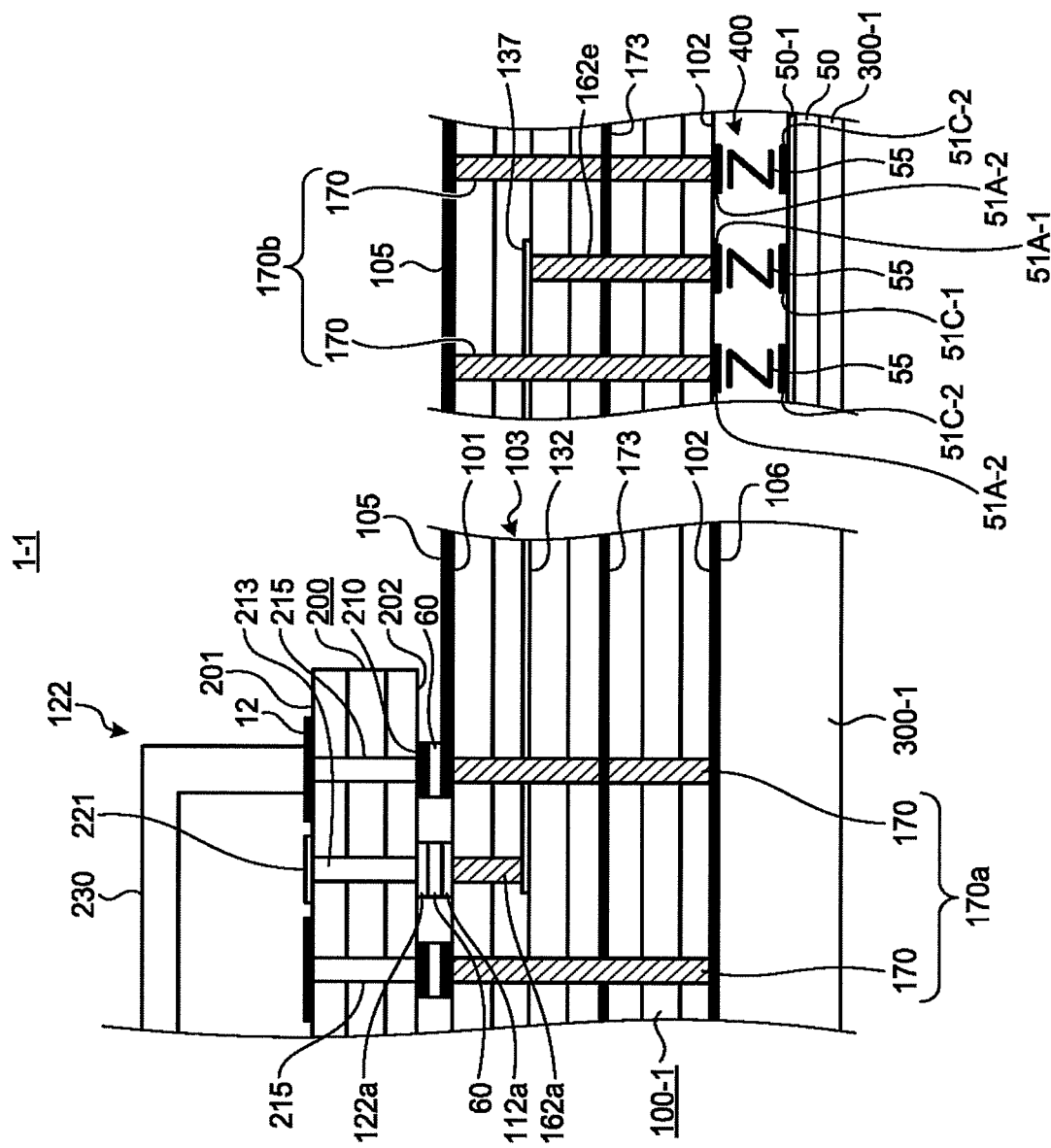
FIG. 17 is a partial enlarged view of the microwave module illustrated in FIG. 14.

FIG. 17 is a partial enlarged view of the microwave module illustrated in FIG. 14. FIG. 17 gives a view of the enlarged contact terminals 55 disposed between the multilayer resin substrate 100-1 and the cooling plate 300-1. The contact terminals 55 are disposed with their ends contacting the RF signal pad 51A-1 and the ground pads 51A-2. Although not illustrated in FIG. 17, the ground pads 51A-2 are electrically connected to the surface ground 106.

A space 400 is formed between the cooling plate 300-1 and the second end face 102. The ground pads 51C-2 and the RF signal pad 51C-1 that is a second pad are formed on the fifth end face 50-1 that is a surface of the distribution circuit board 50 which faces the multilayer resin substrate 100-1. The respective opposite ends of the contact terminals 55 are connected to the ground pads 51C-2 and the RF signal pad 51C-1. The respective opposite ends of the contact terminals 55 may be surface-mounted on the distribution circuit board 50.

The signal through hole 162a that is a first signal through hole is connected to the one end of the RF transmission line 132. The signal through hole 162a is surrounded by a first group 170a of ground through holes among the ground through holes 170, the surface ground 105 that is a first surface ground, and the inner layer surface ground 173.

The opposite end of the RF transmission line 132 is connected to the RF transmission line 137 via another RF device (not illustrated) and thus is connected to a signal through hole 162e that is a second signal through hole. A second group 170b of ground through holes among the ground through holes 170 is provided surrounding the signal through hole 162e and is connected to the inner layer surface ground 173. One end of the signal through hole 162e is connected to one end of the RF transmission line 137.

The RF signal pad 51A-1 that is a first pad is connected to the opposite end of the signal through hole 162e. The ground pads 51A-2 are each connected to the corresponding one end of the ground through holes 170. The opposite ends of the ground through holes 170 are connected to the surface ground 105 and the inner layer surface ground 173. The contact terminal 55 contacting the RF signal pad 51A-1 is connected to the RF transmission line 137 through the signal through hole 162e. The contact terminals 55 contacting the ground pads 51A-2 are connected to the surface ground 105 and the inner layer surface ground 173 through the ground through holes 170. As a result, the antenna-side coaxial RF connector 126, which is surface-mounted on the multilayer resin substrate 100-1 illustrated in FIG. 14 and is fitted via the relay connector 22 to the coaxial connectors 21 fixed to the antenna panel 20, is connected to the contact terminals 55 having spring structures, via the internal circuit 220 that is a microwave circuit illustrated in FIG. 15. Even when the position of the coaxial connector 21 is fixed by the antenna panel 20 as described above, the misalignment between the center positions of the contact terminal 55 and the RF signal pad 51A-1 is allowed as illustrated in FIG. 16, and consequently, the favorable characteristics can be maintained.

Figure 18:
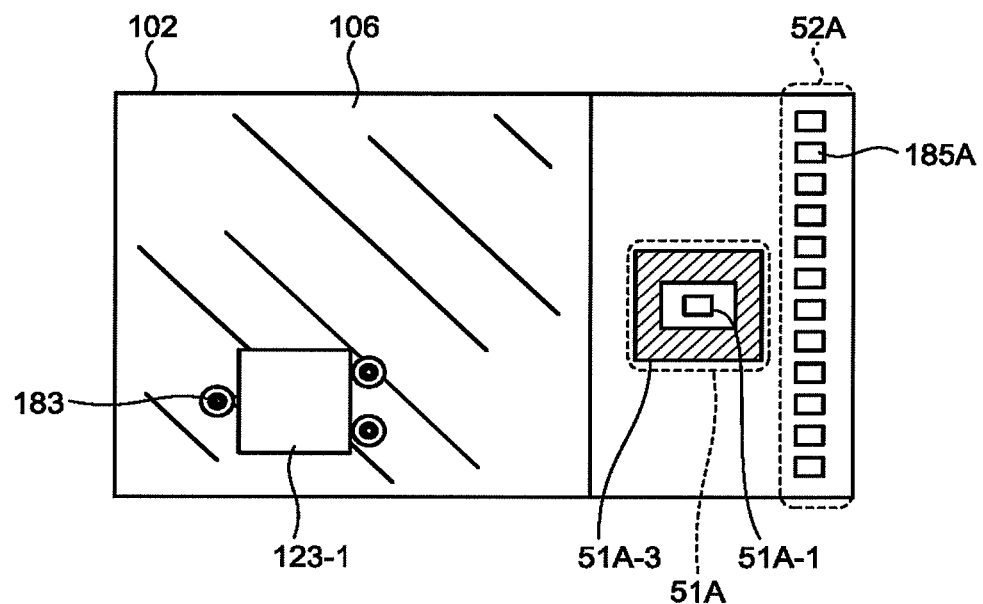
FIG. 18 is a view illustrating a modification to the multilayer resin substrate illustrated in FIG. 10.

FIG. 18 is a view illustrating a modification to the multilayer resin substrate illustrated in FIG. 10. The multilayer resin substrate 100-1 illustrated in FIG. 10 includes the ground pads 51A-2 surrounding the RF signal pad 51A-1 to thereby form a pseudo coaxial structure. The multilayer resin substrate 100-1 illustrated in FIG. 18 uses an annular ground pad 51A-3 surrounding the entire periphery of the RF signal pad 51A-1, instead of using the ground pads 51A-2. The ground pad 51A-3 forms a pseudo coaxial structure. The use of the ground pad 51A-3 can increase the tolerance for misalignment of the mounted components as compared with the use of the ground pads 51A-2.

As described above, the microwave module according to the second embodiment is a microwave module (or a high-frequency module) which includes the multilayer resin substrate, the RF signal pad (51A-1) and the ground pads (51A-2), the cooling plate (300) the spring contact terminals (55), and the circuit board (the distribution circuit board 50). The multilayer resin substrate includes a circuit-mounting surface (the first end face 101), the signal through hole (162a), the ground through holes (170), and the heat dissipator (175). Mounted on the circuit-mounting surface are the microwave devices (the RF devices 120, 121, 122, 123, and 124) which are high-frequency devices electromagnetically shielded from the surroundings thereof. The heat dissipator (175) is thermally connected to the heat dissipator (176) of the microwave device. The RF signal pad (51A-1) and the ground pads (51A-2) are provided on the back surface of the multilayer resin substrate. The cooling plate (300) is thermally connected to the back surface of the multilayer resin substrate and the heat dissipator (175). Each of the spring contact terminals (55) has its one end connected to the corresponding one of the RF signal pad and the ground pads of the multilayer resin substrate. The circuit board (the distribution circuit board 50) is disposed on the cooling plate, includes the pads (the RF signal pad 51C-1 and the ground pads 51C-2) connected to the opposite ends of the contact terminals in the space (400) accommodating the contact terminals, and transmits and receives the high-frequency signals to and from the high-frequency devices via the contact terminals. This arrangement achieves an effect of suppressing an increase in cost. In addition, with the high-frequency device electromagnetically shielded, the heat generated from the high-frequency device can be dissipated via the heat dissipator of the high-frequency device to the heat dissipator of the multilayer resin substrate, and then the heat can be further dissipated from the heat dissipator of the multilayer resin substrate to the cooling plate. Furthermore, since a high-frequency signal can be transmitted via the spring contact terminal between the RF signal pad of the multilayer resin, substrate and the pad of the circuit board attached to the cooling plate, the misalignment error occurring when the high-frequency device is attached to the cooling plate can be accommodated and the signal transmission loss associated with the misalignment error can be reduced.

The configuration described in the embodiments above indicates one example of the content of the present invention and can be combined with other known technology, and a part thereof can be omitted or modified without departing from the gist of the present invention.

The microwave modules (or high-frequency modules) according to the first and second embodiments have been described as the RF devices (120, 121, 122, 123, 123-1, and 124) that are the microwave devices (or high-frequency devices) which transmit and receive an RF signal (high-frequency signal) in a microwave band. However, RF modules (or high-frequency modules) which transmit and receive an RF signal (high-frequency signal) in a millimeter-wave band may be employed.

REFERENCE SIGNS LIST 1, 1-1 microwave module; 2 metal plate; 5 transistor chip; 6 input matching circuit; 7 output matching circuit; 8, 9, 10, 11 bonding wire; 12 ground pattern; 15 cavity; 20 antenna panel; 21 coaxial connector; 22 relay connector; 23 cooling panel; 30 fixing screw; 40 substrate placement component; 50 distribution circuit board; 50-1 fifth end face; 50-2 sixth end face; 51A RF connector pad; 51A-1, 51C-1 RF signal pad; 51A-2, 51A-3, 51C-2 ground pad; 51B RF connector terminal; 51B-1 RF signal contact terminal; 51B-2, 210 ground terminal; 112 power supply control connector; 55 contact terminal; 60 solder layer; 100, 100-1 multilayer resin substrate; 101 first end face; 102 second end face; 103 inner layer portion; 105, 106 surface ground; 112a, 112b, 112c, 112d, 113a, 113b, 113c, 116a, 117a, 118a, 183 land; 120, 121, 122, 123, 123-1, 124 RF device; 122a input RF signal terminal; 122b output RF signal terminal; 122c gate control terminal; 122d drain power supply terminal; 122e ground pad; 125 power supply circuit-side coaxial RF connector; 126 antenna-side coaxial RF connector; 130, 131, 132, 133, 134, 135, 136, 137 RF transmission line; 140 control IC; 141, 142, 143, 225 bypass capacitor; 152c gate control signal line; 152d drain power supply line; 157, 219 RF signal suppression filter; 162a, 162b, 162c, 162d, 162e, 213 signal through hole; 167a, 168a through hole; 170, 215 ground through hole; 170a first group of ground through holes; 170b second group of ground through holes; 173 inner layer surface ground; 175, 176 heat dissipation embedded member; 52A power supply control connector pad; 52B power supply control connector terminal; 52C, 185A pad; 185B contact terminal; 200 device substrate; 201 third end face; 202 fourth end face; 220 internal circuit; 221 signal line; 230 metal cover; 300, 300-1 cooling plate; 400 space; 500, 500-1 microwave module.

The invention claimed is:

1. A microwave module comprising:
a plurality of microwave devices, each of the microwave devices including a microwave circuit, a device substrate, and an electromagnetic shield wall, the device substrate having the microwave circuit mounted thereon, the device substrate including a heat dissipation embedded member thermally connected to the microwave circuit and a signal through hole connected to the microwave circuit, the electromagnetic shield wall covering at least the microwave circuit;
a plurality of multilayer resin substrates, each of the multilayer resin substrates including:
a first end face on which the microwave devices are mounted;
a second end face opposite to the first end face;
a first surface ground provided on a side of the first end face and connected to a ground of the electromagnetic shield wall;
a plurality of first signal through holes, each of the first signal through holes being connected to a signal through hole of the microwave circuit to transmit a microwave signal;
a plurality of first ground through holes, each of the first ground through holes being provided to surround the first signal through holes and connected to the first surface ground,
a second signal through hole connected to the first signal through holes
a plurality of second ground through holes provided to surround the second signal through hole and connected to the first surface ground;
a first pad connected to the second signal through hole and formed on a surface on a side of the second end face;
ground pads arranged so as to surround the first pad and connected to the second ground through holes;
a second surface ground provided on the side of the second end face and connected to the ground pads; and
a heat dissipator thermally connected to the heat dissipation embedded member of the microwave devices and the second surface ground
a cooling plate having the multilayer resin substrates mounted thereon, the cooling plate being thermally connected to the heat dissipator of each of the multiplayer resin substrates, the cooling plate and the second surface ground forming a space therebetween;
a distribution circuit board having a second pad and a plurality of ground pads formed on a surface thereof facing the multilayer resin substrates, the ground pads of the distribution circuit board surrounding the second pads, the distribution circuit board being accommodated in the space of the cooling plate;
a plurality of spring contact terminals, each of the spring contact terminals being connected to the first pad of the multilayer resin substrates and the second pad of the distribution circuit board to transmit a microwave signal to and from the multilayer resin substrates; and a plurality of spring ground contact terminals, each of the spring ground contact terminals being connected to a corresponding one of the ground pads of the multilayer resin substrates and a corresponding one of the ground pads of the distribution circuit board.

2. The microwave module according to claim 1, wherein the multilayer resin substrate has a second microwave device provided on the side of the second end face, and the second microwave device is accommodated in a cavity of the cooling plate and is electromagnetically shielded.

3. The microwave module according to claim 1, comprising a coaxial connector that is surface-mounted on the multilayer resin substrate and is connected to a coaxial connector fixed to an antenna panel, wherein the coaxial connector and the contact terminal are electrically connected.

4. The microwave module according to claim 1, wherein the multilayer resin substrate includes an inner layer surface ground connected to the first ground through holes, and an inner layer signal line surrounded by the first ground through holes, the first surface ground, and the inner layer surface ground, the inner layer signal line having one end connected to the first signal through hole and an opposite end connected to the second signal through hole.

* * * * *